United States Patent [19]

Taniguchi et al.

[11] 4,087,584

[45] May 2, 1978

[54] LITHOGRAPHIC PRINTING PLATE

[75] Inventors: Hiroyoshi Taniguchi; Takao Igawa, both of Tokyo, Japan

[73] Assignee: Ricoh Co., Ltd., Tokyo, Japan

[21] Appl. No.: 734,104

[22] Filed: Oct. 20, 1976

[30] Foreign Application Priority Data

Oct. 31, 1975 Japan ................................ 50-131034

Oct. 31, 1975 Japan ................................ 50-131035

[51] Int. Cl.$^2$ .......................... B41M 1/08; B41N 1/14; G03F 7/02; G03G 13/28

[52] U.S. Cl. .................................... 428/422; 101/453; 101/457; 101/462; 101/463; 101/465; 101/473; 427/144; 428/908

[58] Field of Search ........................ 428/421, 422, 908; 101/453, 452, 451, 454, 457, 462, 463, 465, 473; 427/144

[56] References Cited

U.S. PATENT DOCUMENTS

| | | | |
|---|---|---|---|
| 2,803,615 | 8/1957 | Ahlbrecht et al. | 428/421 X |
| 3,459,722 | 8/1969 | Zanger | 428/422 X |
| 3,515,584 | 6/1970 | Yang | 428/422 X |
| 3,578,444 | 5/1971 | Silver | 101/453 |
| 3,835,780 | 9/1974 | Gracia et al. | 101/454 |
| 3,886,865 | 6/1975 | Ohto et al. | 101/453 X |
| 3,910,187 | 10/1975 | Cords | 101/453 |
| 4,005,237 | 1/1977 | Panken | 428/421 X |
| 4,012,254 | 3/1977 | Crystal | 101/463 |
| 4,015,046 | 3/1977 | Pinkston et al. | 428/422 |
| 4,028,111 | 6/1977 | Iwasaki et al. | 101/453 |
| 4,032,684 | 6/1977 | Dunnington et al. | 428/421 |

*Primary Examiner*—Harold Ansher

*Attorney, Agent, or Firm*—Blanchard, Flynn, Thiel, Boutell & Tanis

[57] ABSTRACT

A lithographic printing plate which comprises using in an ink-repellent layer a polymer of a monomer or a copolymer containing said monomer, said monomer being represented by the following general formulas:

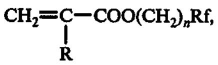

(1)

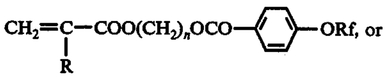

(2)

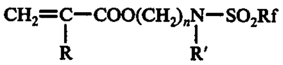

(3)

wherein:

R is hydrogen or a methyl radical; R' is hydrogen or an alkyl radical having 1 to 10 carbon atoms; Rf is a perfluoroalkyl radical having 3 to 21 carbon atoms; and *n* is an integer of 1 to 10.

7 Claims, 2 Drawing Figures

LITHOGRAPHIC PRINTING PLATE

BACKGROUND OF THE INVENTION a) Field of the Invention

The present invention relates to a lithographic printing plate capable of performing in a press without using any wetting liquid.

b) Description of the Prior Art

Hitherto the practically used conventional lithographic printing plates comprise forming oil-sensitive areas and non oil-sensitive areas on substantially the same surface of a substrate such as a zinc plate, an aluminum plate and so forth. When performing the press operation using such prior art printing plates, there can be obtained final printed materials by applying a wetting liquid to non-image areas (non oil-sensitive areas) and applying an oily ink selectively to image areas (oleophilic oil-sensitive areas) and then transferring said oily ink to printing papers through a blanket.

It is well known that the aforesaid printing methods, in which a wetting liquid is used, have encountered various kinds of troubles. In order to eliminate disadvantages resulting from the use of a wetting liquid, therefore, a series of studies and investigations have hitherto been carried out by plate material traders, printers and others. For instance, Japanese Patent Publication No. 29722/1973 discloses a printing plate comprising an ink-repellent layer made of a silicone rubber, an oil-sensitive layer and a substrate, Japanese Laid Open Patent Application No. 904/1975 discloses a printing plate which comprises embedding in an ink-repellent layer particle image patterns that constitute an ink receiving portion, and Japanese Laid Open Patent Application No. 119705/1974 shows a printing plate which comprises provision of a low adhesive layer and a high adhesive layer on a substrate. However, these presently proposed lithographic printing plates are disadvantageous in that plate-making consumes a considerably long time, care is needed in treating plate materials, distinct and ground-unstained printing materials are in fact not obtainable, and further said printing plates are inferior in printing durability.

SUMMARY OF THE INVENTION

An object of the present invention is to provide a wetting liquid-free lithographic printing plate (dry lithographic printing plate). Another object of the present invention is to provide a lithographic printing plate which can readily be made, directly or indirectly, from an original in accordance with a direct painting (lithoprinting) method, electrophotographic method and others. A further object of the present invention is to provide a lithographic printing plate that ensures constant production of distinct printing materials and is superior in printing durability.

In other words, the present invention is concerned with a wetting liquid-free lithographic printing plate, characterized by using in an ink-repellent layer a polymer of a monomer or a copolymer containing said monomer, said monomer being represented by the following general formulas:

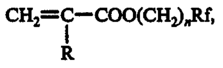 (1)

-continued

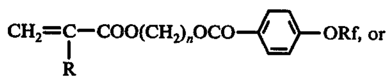 (2)

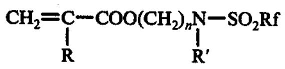 (3)

wherein:

R is hydrogen or a methyl radical; R' is hydrogen or an alkyl radical having 1 to 10 carbon atoms; Rf is a perfluoroalkyl radical having 3 to 21 carbon atoms; and *n* is an integer of 1 to 10.

DETAILED DESCRIPTION OF THE INVENTION

The present invention, as stated above, is featured by using in an ink-repellent layer a polymer of or a copolymer containing a monomer represented by the general formula of (1), (2) or (3). In this connection it is to be noted that "a copolymer containing a monomer" referred to herein includes an inter-polymer of a fluorine-containing monomer represented by aforesaid general formula, too. And various kinds of monomers may be enumerated as those copolymerized with said fluorine-containing monomer, typically, for instance, (1) acrylic acid, methacrylic acid and their methyl, ethyl, butyl, isobutyl, propyl, 2-ethylhexyl, hexyl, decyl, lauryl, stearyl, β-hydroxyethyl and glycidyl esters, (2) vinyl esters of aliphatic acids such as acetic acid, propionic acid, caprylic acid, lauryl acid, stearic acid, etc., (3) styrene compounds such as styrene, α-methyl styrene, β-methyl styrene, etc., (4) vinyl halides or vinylidene compounds such as vinyl fluoride, vinyl chloride, vinyl bromide, vinylidene fluoride, vinylidene chloride, etc., (5) allyl esters of aliphatic acids such as heptanoic acid, caprylic acid, caproic acid, etc., (6) vinyl alkyl ketones such as vinyl methyl ketone, vinyl ethyl ketone, etc., (7) acryl amides such as N-methyl acrylamide, N-methylol methacrylamide, and (8) dienes such as 2,3-dichloro-1,3-butadiene, isoprene, etc.

In the copolymerization of the aforesaid copolymerizable monomer (polymerizing substance) with the fluorine-containing monomer represented by the above-mentioned general formula, in case the former copolymerizable monomer (polymerizing substance) concentrations are in excess of 25 wt. %, a sufficient non-oleophilic property can not be obtained and a superior ink-repellent layer can not be formed. In addition, said fluorine-containing monomer is placed on the market and is readily available.

As for polymerization reaction there can be employed an optional system, for instance, such as bulk polymerization, solution polymerization, suspension polymerization, emulsion polymerization, radiation-induced polymerization or the like. Among them, however, the emulsion polymerization system is profitably employed. In this case it is sufficient to emulsify one or two or more monomers to be polymerized in the presence of an activator, for instance, such as perfluoroalkyl sulfonic acid, perflouorononyloxybenzene, polyfluorosulfonic acid, sodium sulfonate, etc., and polymerize same with stirring.

Figure 1:
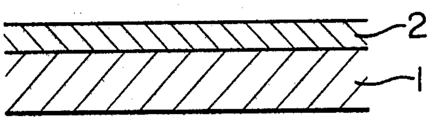
FIG. 1 and FIG. 2 are enlarged sectional views illustrating two embodiments of printing plates according to the present invention. 1 denotes a substrate paper (support), 2 denotes an ink-repellent layer, and 3 denotes a photoconductive layer.
Figure 2:
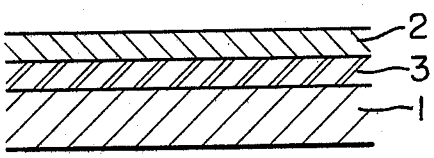

The lithographic printing plate according to the present invention includes those illustrated in FIG. 1, FIG. 2, etc., that of FIG. 1 comprising providing an ink-repellent layer 2 on the surface of a substrate paper (support) 1 and that of FIG. 2 comprising a support 1, an oil-sensitive, electroconductive layer 3 and an ink-repellent layer 2.

Accordingly, the preparation of the direct painting type lithographic printing plate depicted in FIG. 1 may be conducted in the manner of applying onto the support 1, such as paper, plastic film, metal plate or the like, a solution of the polymer of the monomer represented by said general formula or the copolymer containing said momomer in a suitable solvent, for instance, such as 1,1,2-trifluoro-1,2,2-trichloroethane, monofluorotrichloromethane, dichlorodifluoromethane, trifluoromethanol, etc., and drying to thus provide an ink repellent layer 2. The coating amount of the ink repellent layer 2 is not specifically limited herein. However, it is preferable that it is more than 0.5 micron when dried. And the lithographic printing plate put in a printing machine is completed by forming images on this ink-repellent layer 2 by handwriting with an oleophilic magic ink or carbon ink or a ball point pen, typewriter or the like, or by fixing images through oleophilic development according to zerography method.

On the other hand, the preparation of the lithographic printing plate for electrophotography depicted in FIG. 2 may be conducted in the manner of employing, as the substrate, the same support as used in said direct painting (lithoprinting) type lithographic printing plate or a paper subjected to low resistance treatment, providing an oil-sensitive, electroconductive layer 3 onto this substrate 1, if necessary a precoat layer thereon, and further providing an ink-repellent layer 2 thereon.

The thickness of said ink-repellent layer 2 in this case may be varied depending upon various objects, but generally it is to be in the range of from 0.5 to 40 microns when dried, preferably in the range of from 1 to 5 microns. The electroconductive layer 3 is mainly composed of a mixture of carbon black, graphite metal powder, etc., which are caable of imparting electric conductivity, with cellulose nitrate resin, vinyl chloride resin, vinyl acetate resin, epoxy resin, polyethylene, polystyrene, polypropyrene, etc., which serve as a bonding agent, and a plasticizing solvent may be added thereto in an appropriate amount in the coating process. The coating amount of this electroconductive layer is suitably in the range of from 2 to 20 g/m$^2$. The coating of said ink-repellent layer 2 and electroconductive layer 3 is conducted through air knife coating or wire knife coating, and then drying. And in the case of practical plate making it may be effected in the manner of either forming toner images onto the ink-repellent layer 2 by means of well known electrophotographic procedure or discharging electricity onto the ink-repellent layer 2 and breaking it down at the portion corresponding to the image areas of the original by means of a TOSHAFAX plate making machine, thereby exposing in situ the oleophilic electroconductive layer 3.

Then, the printing plate on which images were thus formed is wound round the drum of a printing machine.

Printing ink (oily ink) is carried from an ink pot through a priming roller and a kneading roller, and is received onto the image areas on the ink-repellent layer 2 which comprise toner images or handwritten drawing or onto the electroconductive layer 3 which exposes from the ink-repellent layer 2 and bears drawing. Then, the printing ink transfers, through the blanket or directly, to the object for printing.

The lithographic printing plate according to the present invention is easy to prepare and superior in printing durability, and can produce, on the object for printing, distinct images with scarcely stained ground. In addition, our lithographic printing plate, in which no wetting liquid is utilized, is utterly free from various troubles resulting from the use of wetting liquid. Still further, it is advantageous in that the printing machine used therefor does require no complicated structure.

DESCRIPTION OF THE PREFERRED EMBODIMENS

EXAMPLE 1

A photoconductive layer forming liquid, which is consisted of 100g of ZnO, 50g of acrylic resin (the resin content: 40%), 2 ml of a 5% methanol solution of Rose bengal and 110g of toluene, was applied onto a size-treated kraft paper, and dried at 120° C (the coating amount when dried: 24 g/m$^2$) to thus provide a photoconductive layer thereon. Thereafter, a solution of 1 part by weight of a copolymer represented by the general formula

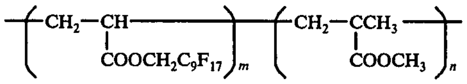

(wherein, m:n=80:20) and 10 parts by weight of 1,1,2-trifluoro-1,2,2-trichloroethane was applied onto said photoconductive layer by means of a wire bar so that the dried layer thickness may be 3microns and dried at 60° C for 10 minutes to thus prepare a printing plate having an ink-repellent layer on its surface.

In accordance with conventional electrophotographic procedure there were formed toner images on the ink-repellent layer provided on the surface of said printing plate thereby to prepare a lithographic printing plate for use in electrophotography. When printing was made with a printing ink for use in dry plate manufactured by 3M Co., by means of a wetting device-free printing machine produced by Ricoh Co., it was found that a lithographic printing plate constructed according to the present invention could be used to run off as many as 2,000 copies without noticeable stain of the plate, ensuring continuous production of distinct printing materials.

EXAMPLE 2

A lithographic printing plate for use in electrophotography was prepared in accordance with the same procedure as used in Example 1 with the exception that an ink-repellent layer forming liquid consisted of 1 part by weight of a copolymer represented by the general formula

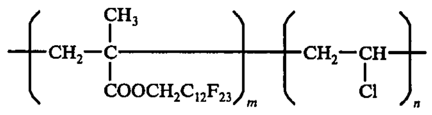

(wherein, m:n=80:20) and 10 parts by weight of 1,1,2-trifluoro-1,2,2-trichloroethane.

This lithographic plate was used for printing purposes to possibly run off as many as 2,000 copies without appreciable degradation of copy characteristic.

EXAMPLE 3

A lithographic printing plate of Example 1 was made by means of a TOSHA-FAX plate making machine. By using the lithographic printing plate thus prepared, printing was made according to the same procedure as used in Example 1 to obtain 2,000 or more of readable and high quality copies.

EXAMPLE 4

An ink-repellent layer forming solution was prepared by mixing 1 part by weight of a polymer represented by the general formula

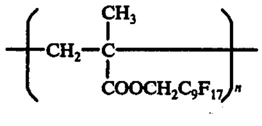

with 10 parts by weight of 1,1,2-trifluoro-1,2,2-trichloroethane. Then, this solution was applied with a wire bar onto a size-treated kraft paper so that the dried film thickness may be 3 microns, and dried at 60° C for 10 minutes to thereby prepare a printing plate.

A direct painting type lithographic printing plate was prepared by providing image areas onto this printing plate, said image areas being formed by drawing images with a magic ink on the ink-repellent layer located on the surface of said printing plate. This lithographic printing plate was used for printing purposes by using the same ink and offset printing machine as used in Example 1 to obtain 2,000 or more of readable and high quality copies.

EXAMPLE 5

A lithographic printing plate for electrophotography was prepared by forming toner images onto the master of Example 4 by means of an electrographic method. This printing plate was subjected to printing to obtain 2,000 or more of high contrast copies.

EXAMPLE 6

A lithographic printing plate was prepared according to the same procedure as used in Example 1 with the exception that an ink-repellent layer forming liquid consisted of 1 part by weight of a polymer represented by the general formuala

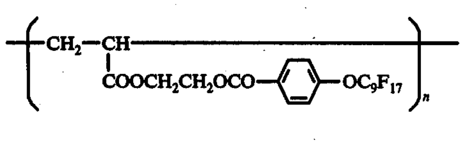

and 10 parts by weight of 1,1,2-trifluoro-1,2,2-trichloroethane.

This printing plate was set to the same printing machine as used in Example 1 for printing purposes, and was observed to be capable of continuously producing as many as 2,000 clear copies without noticeable stain of the plate.

EXAMPLE 7

A lithographic printing plate for use in electrophotography was prepared according to the same procedure as used in Example 1 with the exception that an ink-repellent layer forming liquid consisted of 1 part by weight of a polymer represented by the general formula

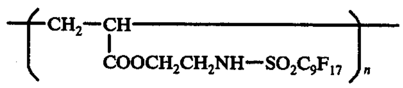

and 10 parts by weight of 1,1,2-trifluoro-1,2,2-trichloroethane, and was used for printing purposes. It was observed that said printing plate was able to produce as many as 2,000 copies without appreciable degradation of image characteristic.

EXAMPLE 8

A lithographic printing plate for use in electrophotography was prepared according to the same procedure as used in Example 1 with the exception that an ink-repellent layer forming liquid consisted of 1 part by weight of a copolymer represented by the general formula

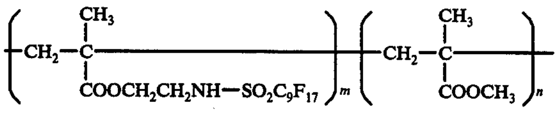

(wherein, m:n=80:20) and 10 parts by weight of 1,1,2-trifluoro-1,2,2-trichloroethane, and was used for printing purposes. The results obtained therefrom were same as those of Example 1.

EXAMPLE 9

A lithographic printing plate of Example 6 was made by means of a TOSHA-FAX plate making machine. By using the lithographic printing plate thus prepared, printing was made according to the same procedure as used in Example 6 to obtain 2,000 or more of readable and high quality copies.

EXAMPLE 10

A direct painting type lithographic printing plate was prepared according to the same procedure as used in Example 4 with the exception that an ink-repellent layer forming liquid consisted of 1 part by weight of a copolymer represented by the general formula

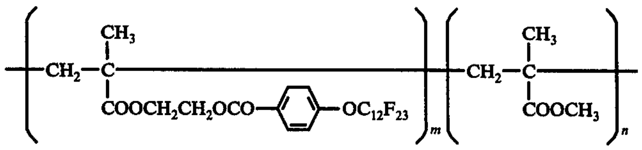

(wherein, m:n=80:20) and 10 parts by weight of 1,1,2-trifluoro-1,2,2-trichloroethane, and was used for printing purposes. The results obtained therefrom were substantially same as those of Example 4.

EXAMPLE 11

A direct painting type lithographic printing plate was prepared according to the same procedure as used in Example 4with the exception that an ink-repellent layer forming liquid consisted of 1 part by weight of a polymer represented by the general formula

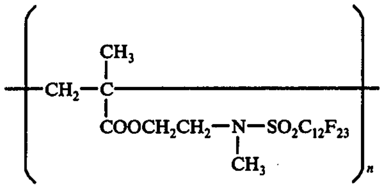

and 10 parts by weight of 1,1,2-trifluoro-1,2,2-trichloroethane, and was used for printing purposes. The results obtained therefrom were substantially same as those of Example 4.

EXAMPLES 12 and 13

Toner images were formed onto an ink-repellent layer by means of an electrographic method as in Examples 10 and 11. By using the same as a printing plate, printing was made, resulting in 2,000 or more of high contrast copies.

What is claimed is:

1. A lithographic printing plate comprising a support having an ink-repellent layer thereon, said ink-repellent layer consisting essentially of a polymer of a first monomer having the formula

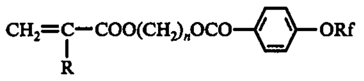

wherein R is hydrogen or methyl, Rf is perfluoroalkyl having from 3 to 21 carbon atoms, and *n* is an integer of one to 10, said polymer containing up to 25 percent by weight of units of a second monomer which is copolymerizable with said first monomer.

2. A printing plate according to claim 1 wherein said second monomer is at least one member selected from the group consisting of (1) acrylic acid, methacrylic acid and the methyl, ethyl, butyl, isobutyl, propyl, 2-ethylhexyl, hexyl, decyl, lauryl, stearyl, β-hydroxyethyl and glycidyl esters thereof, (2) vinyl esters of aliphatic acids selected from the group consisting of acetic acid, propionic acid, caprylic acid, lauric acid and stearic acid, (3) styrene compounds selected from the group consisting of styrene, β-methyl styrene and β-methyl styrene, (4) vinyl and vinylidene halides selected from the group consisting of vinyl fluoride, vinyl chloride, vinyl bromide, vinylidene fluoride and vinylidene chloride, (5) allyl esters of aliphatic acids selected from the group consisting of heptanoic acid, caprylic acid and caproic acid, (6) vinyl alkyl ketones selected from the group consisting of vinyl methyl ketone and vinyl ethyl ketone, (7) acrylamides selected from the group consisting of N-methyl acrylamide and N-methylol methacrylamide, and (8) dienes selected from the group consisting of 2,3-dichloro-1,3-butadiene and isoprene.

3. A lithographic printing plate according to claim 1 in which said second monomer is at least one member selected from the group consisting of (1) acrylic acid, methacrylic acid and esters thereof, (2) vinyl esters of aliphatic carboxylic acids, (3) styrene compounds, (4) vinyl and vinylidene halides, (5) allyl esters of aliphatic carboxylic acids, (6) vinyl alkyl ketones, (7) acrylamides and (8) dienes.

4. A lithographic printing plate according to claim 1 consisting of said support and said ink-repellent layer.

5. A lithographic printing plate according to claim 1 consisting of said support, a photoconductive layer on top of said support and said ink-repellent layer on top of said photoconductive layer.

6. A lithographic printing plate according to claim 1 in which the recurring structural units of said polymer have the formula

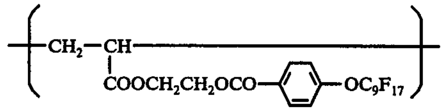

7. A lithographic printing plate according to claim 1 in which said polymer has the formula

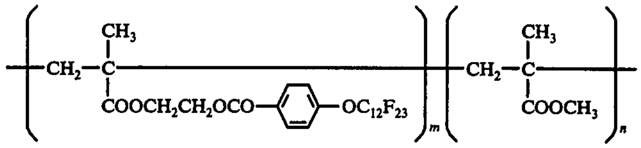

wherein m:n=80:20.

* * * * *

UNITED STATES PATENT AND TRADEMARK OFFICE

CERTIFICATE OF CORRECTION

PATENT NO. : 4 087 584

DATED : May 2, 1978

INVENTOR(S) : Hiroyoshi Taniguchi et al

It is certified that error appears in the above-identified patent and that said Letters Patent are hereby corrected as shown below:

Column 8, line 10; change "β-methyl styrene" to ---α-methyl styrene---.

Signed and Sealed this

*Third* Day of *October 1978*

[SEAL]

*Attest:*

RUTH C. MASON
*Attesting Officer*

DONALD W. BANNER
*Commissioner of Patents and Trademarks*